(12) United States Patent
Piveteau et al.

(10) Patent No.: US 11,042,715 B2
(45) Date of Patent: Jun. 22, 2021

(54) ELECTRONIC SYSTEM FOR PERFORMING A MULTIPLICATION OF A MATRIX AND VECTOR

(71) Applicant: International Business Machines Corporation, Armonk, NY (US)

(72) Inventors: Christophe Piveteau, Zurich (CH); Abu Sebastian, Adliswil (CH); Manuel Le Gallo-Bourdeau, Zurich (CH); Riduan Khaddam-Aljameh, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 16/381,613

(22) Filed: Apr. 11, 2019

(65) Prior Publication Data
US 2020/0327287 A1    Oct. 15, 2020

(51) Int. Cl.
  *G06F 7/16*    (2006.01)
  *G06G 7/16*    (2006.01)
  *G06F 17/16*   (2006.01)
  *G11C 13/00*   (2006.01)

(52) U.S. Cl.
  CPC ............ *G06G 7/16* (2013.01); *G06F 17/16* (2013.01); *G11C 13/0026* (2013.01); *G11C 13/0028* (2013.01); *G11C 2213/77* (2013.01)

(58) Field of Classification Search
  CPC ....... G06F 7/16; G06F 17/16; G11C 13/0028; G11C 13/0026; G11C 2213/77; G11C 13/003; G11C 13/0007; G06J 1/00

USPC ............................................. 708/835
  See application file for complete search history.

(56) References Cited

U.S. PATENT DOCUMENTS

| | | | |
|---|---|---|---|
| 2017/0228345 A1* | 8/2017 | Gupta | G06F 17/16 |
| 2017/0316827 A1 | 11/2017 | Ge et al. | |
| 2018/0113649 A1 | 4/2018 | Shafiee Ardestani et al. | |

(Continued)

FOREIGN PATENT DOCUMENTS

WO    2017105460 A1    6/2017

OTHER PUBLICATIONS

Burr., G.W., et al., "Neuromorphic computing using non-volatile memory", Advances in Physics: X, 2016, Accepted Nov. 1, 2016, Published online Dec. 4, 2016, pp. 89-124, vol. 2, No. 1.

(Continued)

*Primary Examiner* — Tan V Mai
(74) *Attorney, Agent, or Firm* — Scully, Scott, Murphy & Presser, P.C.; Daniel P. Morris

(57) ABSTRACT

A system can include a memristive crossbar array, which can include row lines and column lines intersecting the row lines. Resistive memory elements can be coupled between the row lines and the column lines at the junctions formed by the row and column lines. The resistive memory elements represent the values of the matrix. The system can further include an analogue circuit. The system can be configured to perform an exponentiation of the values of the vector in accordance with a first exponent. The crossbar array can be configured to apply the resulting values of the vector to the resistive elements thereby generating currents. The analogue circuit can be configured to perform an exponentiation of the generated currents in accordance with a second exponent.

16 Claims, 5 Drawing Sheets

(56) References Cited

U.S. PATENT DOCUMENTS

2018/0114569 A1    4/2018  Strachan et al.
2019/0205741 A1*   7/2019  Gupta .................... G06F 17/13

OTHER PUBLICATIONS

Zidan, M., et al., "The future of electronics based on memristive systems", Nature Electronics, Jan. 2018, pp. 22-29, vol. 1.

Nandakumar, S.R., et al., "A phase-change memory model for neuromorphic computing", Journal of Applied Physics, 2018, accepted Oct. 1, 2018, published online Oct. 17, 2018, pp. 152135-1-152135-11, vol. 24.

Gupta, I., et al., "Real-time encoding and compression of neuronal spikes by metal-oxide memristors", Nature Commnunications, Accepted Aug. 3, 2016, Published Sep. 26, 2016, pp. 1-9, vol. 7:12805.

Saatlo, A.N., et al., "Applications of a CMOS Current Squaring Circuit in Analog Signal Processing", 2015 38th International Conference on Telecommunications and Signal Processing (TSP), pp. 339-343.

\* cited by examiner

ELECTRONIC SYSTEM FOR PERFORMING A MULTIPLICATION OF A MATRIX AND VECTOR

BACKGROUND

The present disclosure relates to the field of digital computer systems, and more specifically, to an electronic system for performing a multiplication of a matrix and vector.

The computational memory is a promising approach in the field of non-von Neumann computing paradigms, in which nanoscale resistive memory devices are simultaneously storing data performing basic computational tasks. For example, by arranging these devices in a crossbar configuration, matrix-vector multiplications may be performed. However, inter-device variability, non-ideal characteristics of resistive memories such as the electronic noise, drift and temperature dependence affect seriously the computational precision.

SUMMARY

Various embodiments provide an electronic system for performing a multiplication of a matrix and vector, method and computer program product as described by the subject matter of the independent claims. Advantageous embodiments are described in the dependent claims. Embodiments of the present invention can be freely combined with each other if they are not mutually exclusive.

In one aspect, the invention relates to an electronic system for performing a multiplication of a matrix and vector, the system comprising a crossbar array (or referred to as memristive crossbar array) comprising row lines and column lines intersecting the row lines, and resistive memory elements coupled between the row lines and the column lines at the junctions formed by the row and column lines, the resistive memory elements representing the values of the matrix, the system further comprising an analogue circuit, the system being configured to perform an exponentiation of the values of the vector in accordance with a first exponent, the crossbar array being configured to apply the resulting values of the vector to the resistive elements thereby generating currents, the analogue circuit being configured for performing an exponentiation of the generated currents in accordance with a second exponent.

In another aspect, the invention relates to a method for performing a multiplication of a matrix and vector for a system comprising a memristive crossbar array, the crossbar array comprising row lines and column lines intersecting the row lines, and resistive memory elements coupled between the row lines and the column lines at the junctions formed by the row and column lines, the resistive memory elements representing the values of the matrix, the method comprising performing an exponentiation of the values of the vector in accordance with a first exponent, applying the resulting values of the vector to the resistive elements thereby generating currents, and performing an exponentiation of the generated currents in accordance with a second exponent.

In another aspect, the invention relates to a computer program product comprising a computer-readable storage medium having computer-readable program code embodied therewith, the computer-readable program code configured to performing a multiplication of a matrix and vector for a system comprising a memristive crossbar array, the crossbar array comprising row lines and column lines intersecting the row lines, and resistive memory elements coupled between the row lines and the column lines at the junctions formed by the row and column lines, the resistive memory elements representing the values of the matrix. The computer-readable program code configured to perform an exponentiation of the values of the vector in accordance with a first exponent, apply the resulting values of the vector to the resistive elements thereby generating currents, and perform an exponentiation of the generated currents in accordance with a second exponent.

BRIEF DESCRIPTION OF THE DRAWINGS

In the following embodiments of the invention are explained in greater detail, by way of example only, making reference to the drawings in which.

DETAILED DESCRIPTION

The descriptions of the various embodiments of the present invention will be presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 7A:
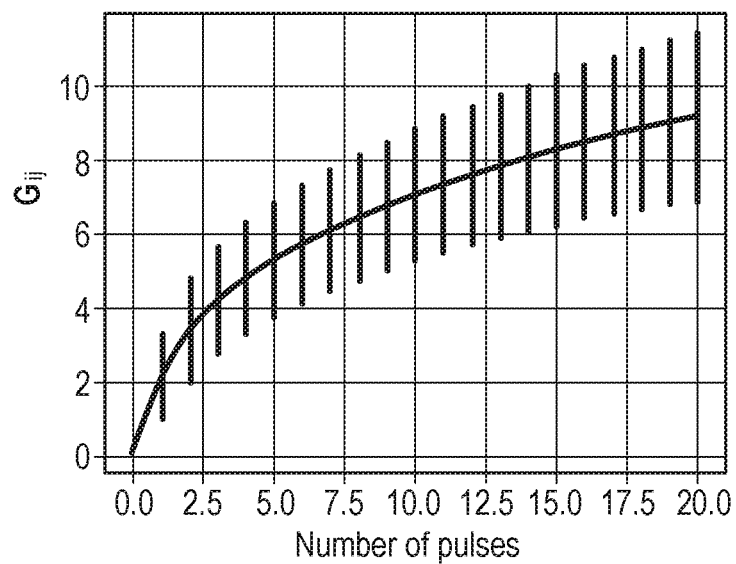
FIG. 7A is the programming curve of a crossbar array in accordance with a first matrix-conductance representation scheme.

The matrix-vector multiplication of a matrix W and vector x may be realized through a memristive crossbar array by representing each matrix element with the conductance of the corresponding memristor element of the array, wherein the multiplication of the matrix W and vector x may be performed by inputting voltages representing the vector values to the crossbar array and the resulting currents are indicative of the product of W and x. A resistive memory element (or device) of the crossbar array may for example be one of a phase change memory (PCM), metal-oxide resistive RAM, conductive bridge RAM and magnetic RAM. The representation scheme of the matrix W and conductance G of the crossbar array that enables to obtain the final product may be the following scheme $$W_{ij} = \frac{W_{max}}{G_{max}} G_{ij},$$

where $G_{max}$ is given by the conductance range of the crossbar array and $W_{max}$ is chosen depending on the magnitude of matrix W. The linearity of the programming behavior is key for many applications, since it ensures that the induced change in the conductance caused by a programming pulse is independent of the number of previously applied programming pulses (e.g. programming pulses may be applied to an element of the array such that the conductance of the element is changed by a desired conductance value). However, this may not be the case with exiting systems as it is illustrated in FIG. 7A. This may thus impact the precision of the computed multiplication. The present subject matter may solve these issues as it may enable to efficiently adapt the representation scheme by manipulating the inputs and outputs of the crossbar array. This may involve a pre-processing step for exponentiation of the input vector values and a post-processing step for exponentiation of the output currents. These pre and post-processing steps may be constructed in such a way that the effective matrix element values have desirable properties for a computational algorithm. The present subject matter may thus improve the accuracy of algorithms where the weight matrices are regularly updated (e.g. training neural networks), in particular it may improve performance of machine learning processes where such multiplications are involved. For example, the present method may be used for learning neural networks. The changes that may be made compared to a regular approach of mapping neural networks on crossbar arrays may consist of applying described pre- and post-processing technique during forward and backward propagation.

According to one embodiment, the analogue circuit comprises exponentiation circuits, wherein each exponentiation circuit of the exponentiation circuits is configured to connect to a respective resistive memory element of the crossbar, the exponentiation circuit being configured for performing, using the second exponent, the exponentiation of the current associated with the resistive memory element to which the exponentiation circuit is connected. This embodiment may provide a compact and resources saving structure that may be more advantageous in case of systems with limited resources. The present subject matter may enable that a memristive crossbar array where the data entering the array as well as the current flowing through each individual memristor element is pre- and post-processed such that the effective matrix element values perceived by a computational algorithm using the array is altered. These pre- and post-processing techniques may especially be advantageous in the context of deep learning; as having precise weight updates can significantly improve neural network performance.

According to one embodiment, the crossbar is configured to apply the values of the vector sequentially, the analogue circuit comprising for each column line of the crossbar an exponentiation circuit and an integration circuit, wherein for each sequentially applied value and for each column line of the crossbar, the exponentiation circuit being configured to perform the exponentiation of the current output of the column line resulting from the application of that value, and the integration circuit being configured to integrate the current output. This embodiment may be advantageous as it may provide a flexible implementation of the present system. For example, the analogue circuit may be combined (connected to) with different types of crossbar arrays.

According to one embodiment, the exponentiation and integration circuits are part of a single circuit. This may enable an efficient and compact implementation which may reduce demands of hardware resources.

According to one embodiment, the system is configured to activate a row line of the crossbar that receives the value of the vector to be applied. This may enable that all voltages may be applied (as usual) and only the activated row line may allow the corresponding voltage to be applied. For example, each row line may be connected to a switching logic that enables or not a voltage to be applied in that line. For example, the row lines may be activated following a predefined order e.g. the first row line is first activated followed by the second until the last row line is activated. This may enable a systematic processing of the present subject matter. In another example, the row lines may be activated sequentially following a randomly chosen order. This may provide an alternative implementation and thus may increase the flexibility of using the present system.

According to one embodiment, the system further comprises a digital or analogue co-processor logic configured for performing the exponentiation of the values of the vector in accordance with a first exponent.

According to one embodiment, the ratio of first and second exponents is 1. The first and second exponents may cancel out such that the original representation scheme may be maintained while the perceived conductance values may change to improve the linearity.

According to one embodiment, the first and second exponents are provided such that the matrix items $W_{ij}$ can be mapped to the conductances G of the elements of the crossbar array as follows:

$$W_{ij} = \frac{W_{max}}{G_{max}^\alpha} G_{ij}^\alpha, \text{ where } (W \cdot x)_j = \sum_i W_{ji} x_i = \frac{W_{max}}{G_{max}^\alpha} \sum_i (G_{ji}(x_i)^{1/\alpha})^\alpha,$$

wherein the first exponent is $1/\alpha$ and the second exponent is $\alpha$, wherein Wmax and Gmax are predefined range values.

According to one embodiment, the exponentiation of a value x of the vector is performed as follows: $\text{sign}(x)|x|^{1/\alpha}$, and the exponentiation of a current I is performed as follows $\text{sign}(I)|I|^\alpha$.

According to one embodiment, the exponentiation circuit comprises a CMOS current squaring circuit for each current direction of the current.

According to one embodiment, the method comprises determining an average conductance $G_{mean}$ of the crossbar array for a predefined number N of received potentiation pulses at one or more elements of the crossbar array; finding values of c and $\alpha$ that minimize $\Sigma_{N=1}^{Nmax}[c \, G\text{mean}(N)^\alpha - N]^2$, wherein the first exponent is $1/\alpha$ and the second exponent is $\alpha$.

According to one embodiment, the crossbar array represents (e.g. a layer) at least part of a deep neural network, wherein the method is performed for forward and backward propagation during learning of the deep neural network. For example, the method may be used for computing matrix and vector products required for synaptic updates of a deep neural network.

Figure 1:
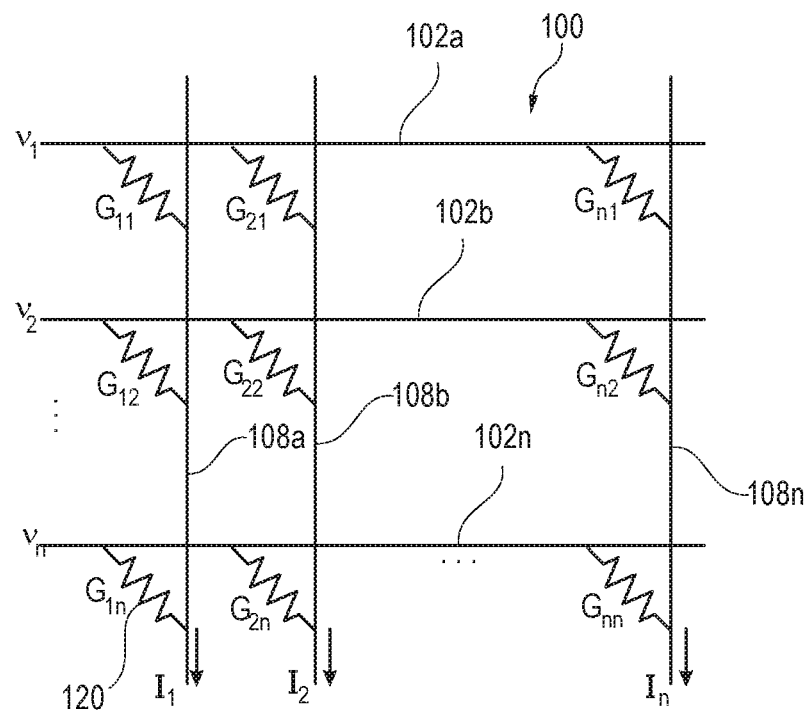
FIG. 1 depicts a crossbar array of memristors.

FIG. 1 depicts a crossbar array of memristors (or resistive processing units (RPUs)) that provide local data storage along with voltage sequences illustrating the operation of the memristors FIG. 1 is a diagram of a two-dimensional (2D) crossbar array 100 that may for example perform matrix-vector multiplication. Crossbar array 100 is formed from a set of conductive row wires 102a . . . 102n and a set of conductive column wires 108a . . . n that intersect the set of conductive row wires 102a-n.

The conductive column wires may be referred to as column lines and conductive row wires may be referred to as row lines. The intersections between the set of row wires and the set of column wires are separated by memristors, which are shown in FIG. 1 as resistive elements each having its own adjustable/updateable resistive weight or conductance, depicted as $G_{ij}$, respectively where i=1 . . . n, and j=1 . . . n. For ease of illustration, only one memristor 120 is labeled with a reference number in FIG. 1.

Input voltages $v_1$ . . . vn are applied to row wires 102a-n respectively. Each column wire 108a-n sums the currents $I_1$, $I_2$ . . . $I_n$ generated by each memristor along the particular column wire. For example, as shown in FIG. 1, the current $I_2$ generated by column wire $108_b$ is according to the equation $I_2=v_1 \cdot G_{21}+v_2 \cdot G_{22}+v_3 \cdot G_{23}+ \ldots +v_n \cdot G_{2n}$. Thus, array 100 computes the matrix-vector multiplication by multiplying the values stored in the memristors by the row wire inputs, which are defined by voltages $v_{1-n}$. Accordingly, the multiplication may be performed locally at each memristor 120 of array 100 using the memristor itself plus the relevant row or column wire of array 100.

The crossbar array of FIG. 1 may for example enable to compute the multiplication of a vector x with a matrix W. The items $W_{ij}$ of the matrix W may be mapped onto corresponding conductances of the crossbar array as follows:

$$W_{ij} = \frac{W_{max}}{G_{max}} G_{ij},$$

where $G_{max}$ is given by the conductance range of the crossbar array 100 and $W_{max}$ is chosen depending on the magnitude of matrix W. However, since the memristor elements 120 may exhibit strongly nonlinear programming curves (conductance versus number of applied programming pulses), this first representation scheme $$W_{ij} = \frac{W_{max}}{G_{max}} G_{ij}$$

may be improved to take into account such a non-linearity. For that, this first representation scheme may be improved to become nonlinear as follows $$W_{ij} = \frac{W_{max}}{G_{max}^\alpha} G_{ij}^\alpha,$$

where $\alpha$ is a real non-negative number. This nonlinearity of the second representation scheme may compensate the programming nonlinearity present in memristive elements.

Figure 2:
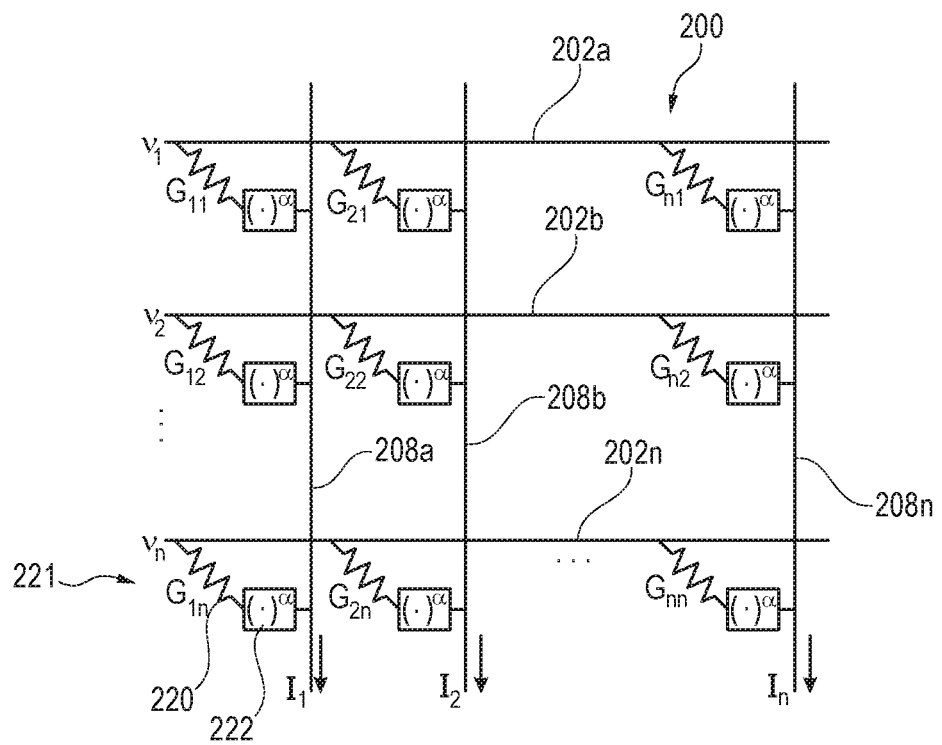
FIG. 2 depicts a diagram of a crossbar array for performing matrix-vector multiplication in accordance with the present subject matter.
Figure 3:
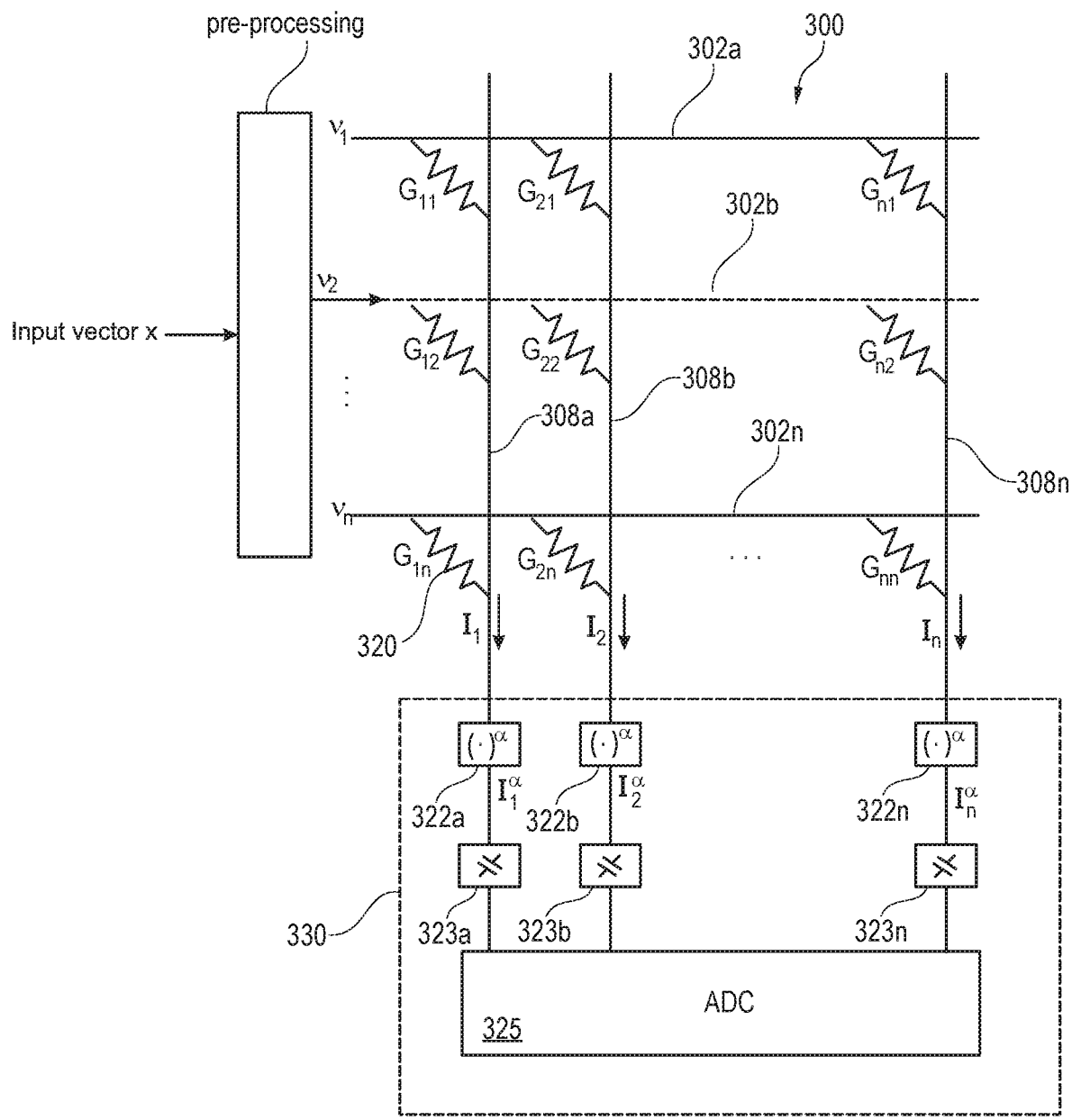
FIG. 3 is a diagram of a system comprising a crossbar array connected to an analogue circuit for performing a matrix-vector multiplication in accordance with the present subject matter.

The second representation scheme may for example be implemented by each of the systems of FIG. 2 and FIG. 3.

FIG. 2 is a diagram of a system comprising a 2D crossbar array 200 that may for example perform matrix-vector multiplication in accordance with the present subject matter. Crossbar array 200 is formed from a set of conductive row wires 202a . . . 202n and a set of conductive column wires 208a . . . n that intersect the set of conductive row wires 202a-n. The conductive column wires may be referred to as column lines and conductive row wires may be referred to as row lines. The intersections between the set of row wires and the set of column wires are separated by devices 221, wherein each device 221 comprises a resistive element 220 having its own adjustable/updateable resistive weight, depicted as $G_{ij}$ where i=1 . . . n, and j=1 . . . n and exponentiation circuit 222. For ease of illustration, only one device 221 is labeled with a reference number in FIG. 2.

Input voltages $v_1$ . . . $v_n$ are applied to row wires 202a-n respectively. Each of the input voltage is an exponentiation of a respective value of a vector x, where $v_i = x_i^{1/\alpha}$. For example, a pre-processing step may be performed in a digital or analogue co-processor in order to perform the exponentiation $x_i^{1/\alpha}$.

Each column wire 208a-n sums the currents $I_1$, $I_2$ . . . $I_n$ generated by each device 220 along the particular column wire. For example, as shown in FIG. 2, the current $I_2$ generated by column wire $208_b$ is according to the equation $I_2=(v_1 \cdot G_{21})^\alpha+(v_2 \cdot G_{22})^\alpha+(v_3 \cdot G_{23})^\alpha+ \ldots (v_n \cdot G_{2n})^\alpha$. Thus, array 200 computes the matrix-vector multiplication by multiplying the values stored in the memristors by the row wire inputs, which are defined by voltages $v_{1-n}$ and by exponentiation of the results of the multiplications.

The crossbar array of FIG. 2 may for example enable to compute the multiplication of the vector x with a matrix W. The items $W_{ij}$ of the matrix W may be mapped onto corresponding conductances of the crossbar array as follows:

$$W_{ij} = \frac{W_{max}}{G_{max}^\alpha} G_{ij}^\alpha,$$

where $G_{max}$ is given by the conductance range of the crossbar array 200 and $W_{max}$ is chosen depending on the magnitude of matrix W and $\alpha$ is a real non-negative number. With the second representation scheme, the multiplication of the matrix W and a vector x may be decomposed as follows:

$$(W \cdot x)_j = \Sigma_i W_{ji} x_i = \frac{W_{max}}{G_{max}^\alpha} \Sigma_i \left( G_{ji}(x_i)^{1/\alpha} \right)^\alpha.$$

This decomposition suggests to pre-process input vector values $x_i$ by element-wise power to $1/\alpha$ and to post-process the summands of the matrix-vector multiplication by a power of $\alpha$.

FIG. 3 is a diagram of a system comprising a 2D crossbar array 300 that is connected to an analogue circuit 330 for performing a matrix-vector multiplication in accordance with the present subject matter. Crossbar array 300 is formed from a set of conductive row wires 302a . . . 302n and a set of conductive column wires 308a . . . n that intersect the set of conductive row wires 302a-n. The conductive column wires may be referred to as column lines and conductive row wires may be referred to as row lines. The intersections between the set of row wires and the set of column wires are separated by memristors, which are shown in FIG. 3 as resistive elements each having its own adjustable/updateable resistive weight, depicted as $G_{ij}$, respectively where i=1 . . . n, and j=1 . . . n. For ease of illustration, only one memristor 320 is labeled with a reference number in FIG. 3. Input voltages $v_1$ . . . $v_n$ are applied to row wires 302a-n respectively. The voltages are applied sequentially following a predefined sequence e.g. $v_1$ followed by $v_2$, $v_3$ . . . and $v_n$. The input voltages are sequentially applied to the crossbar, wherein only one crossbar row is activated at a time. Activating a row line may be performed, in one example, by applying only the voltage associated to that row line e.g.

activating the second row line comprises applying $v_2$ only. In another example, activating a row line may be performed using switching logics that are connected to respective row lines. This example may be advantageous as all voltages can be applied (as usual) but only the desired one would be applied by activating the corresponding row line e.g. using the switching logic.

As illustrated in FIG. 3, the voltage $v_2$ may be the voltage being applied. For example, when applying the voltage $v_2$, corresponding row wire 302b is activated while the other row wires are not activated. After applying $v_2$, $v_3$ may be applied. For that, the row wire 302c may be activated and remaining row wires may be not activated. Each of the input voltages is an exponentiation of a respective value of a vector x by a first exponent $1/\alpha$, where $v_i=x_i^{1/\alpha}$. Each column wire 308a-n provides the currents $I_1, I_2 \ldots I_n$ generated by each memristor along the particular column wire and whose row wire is activated. For example, when the row wire 302b is activated, the column wire 308a may provide current $I_1$ which is generated by the single memristor at the intersection between the column wire 308a and the row wire 302b, $I_1=v_2 \cdot G_{12}$.

Each column wire 308a-n is connected with a respective pair of exponentiation circuit 322a-n and integration circuit 323a-n. For example, the column wire 308b is connected with exponentiation circuit 322b and integration circuit 323b. The integration circuit 323a-n may be an integration capacitor. Each of the exponentiation circuits 322a-n is configured to receive the provided current $I_{1-n}$ of the column wire 308a-n to which it is connected and to perform an exponentiation of the received current using a second exponent a. For example, when the row wire 302b is activated, the exponentiation circuit 322b may receive the current $I_2$ that is output of the column wire 308b, wherein $I_2=v_2 \cdot G_{22}$. The exponentiation circuit 322b may perform an exponentiation of the received current $I_2$ using the second exponent such that the resulting output of the exponentiation circuit 322b is $I_2^\alpha$.

The integration circuits 323a-n are configured to receive and integrate the outputs, $I_1^\alpha, I_2^\alpha \ldots I_n^\alpha$ of the exponentiation circuits 322a-n respectively. For example, when the row wire 302b is activated, the exponentiation circuit 323b may have been received the output $I_2=(v_2 \cdot G_{21})$ that resulted from the activation of the row wire 302a and may further received the output $I_2=(v_2 \cdot G_{22})$ that results from the activation of the row wire 302b. The integration circuit may then integrate both received outputs as follows: $(v_2 \cdot G_{21})^\alpha+(v_2 \cdot G_{22})^\alpha$. Thus, the results over the different row wires are effectively added together by the integration capacitor.

Once all input voltages have been cycled through, the capacitor charges are read out and digitized using an ADC 325. The output of the ADC 325 may be the result of the multiplication of W·x. The system of FIG. 3 may thus enable to compute the multiplication of the vector x with a matrix W. The items $W_{ij}$ of the matrix W may be mapped onto corresponding conductances of the crossbar array as follows:

$$W_{ij} = \frac{W_{max}}{G_{max}^\alpha} G_{ij}^\alpha,$$

where $G_{max}$ is given by the conductance range of the crossbar array 300 and $W_{max}$ is chosen depending on the magnitude of matrix W and $\alpha$ is a real non-negative number. For example, when applying the i-th element of the input vector, the j-th integration capacitor accumulates the value $(G_{ji} (x_i)^{1/\alpha})^\alpha$ and after having applied all the input vector elements, the integration capacitor therefore contain the value $\Sigma_i (G_{ji} (x_i)^{1/\alpha})^\alpha$, which is the result of the multiplication of W·x (up to a scaling factor). The system of FIG. 3 may be advantageous as the exponentiation of the currents is performed outside the crossbar by the analogue circuit 330.

For simplification of the description, the vector values $x_i$ described herein are positive values. In case of a negative value $x_i$, the exponentiation of $x_i$ (e.g. in the pre-processing step) may be performed as follows: $\text{sign}(x_i)|x_i|^{1/\alpha}$, taking into account the sign of $x_i$ which is $\text{sign}(x_i)$. Also, for simplification of the description, the current values I described herein are positive values. In case of a negative value $I_i$, the exponentiation of $I_i$ (e.g. in the post-processing step) may be performed as follows: $\text{sign}(I_i)|I_i|^\alpha$, taking into account the sign of $I_i$ which is $\text{sign}(I_i)$.

Figure 4:
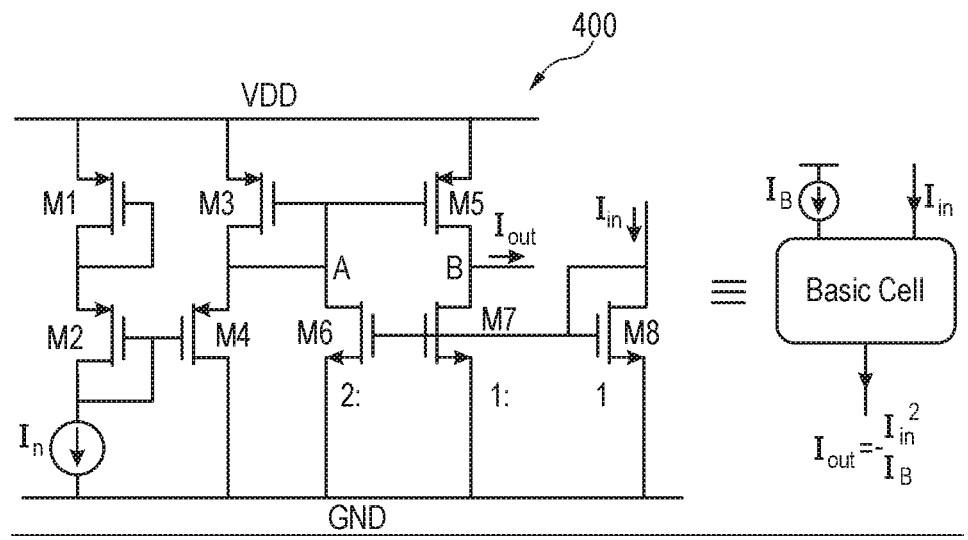
FIG. 4 depicts a diagram of an example CMOS squaring circuit.

FIG. 4 depicts a diagram of an example CMOS squaring circuit 400 (e.g., as described in Applications of a CMOS current squaring circuit in analogue signal processing, Saatlo et al., 2015 38th International Conference on Telecommunications and Signal Processing (TSP)) that can be used for the exponentiation circuit of the present subject matter. In order to cover the possibility of nonnegative vector values, the exponentiation circuit may be configured to do the operation $1 \rightarrow \text{sign}(I)|I|^\alpha$. For that, the exponentiation circuit may comprise one circuit 400 dedicated for each current direction. The exponentiation circuit is configured to decide based on the sign of the current which of the two circuits to use for performing the exponentiation.

Figure 5:
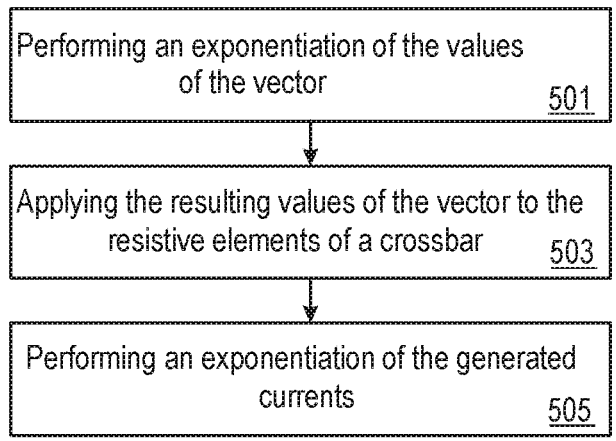
FIG. 5 is a flowchart of a method for performing a multiplication of a matrix W and vector x.

FIG. 5 is a flowchart of a method for performing a multiplication of a matrix W and vector x for a system such as system of FIGS. 2 and 3. An exponentiation of the values of the vector x may be performed in accordance with a first exponent in step 501. Step 501 may be a pre-processing step that may be performed by a digital or analogue co-processor. For example, the result of exponentiation of each value $x_i$ of the vector x may be as follows $v_i=x_i^{1/\alpha}$. The resulting values $v_i$ of the vector x to may be applied the resistive elements 120, 220 or 320. This may result in generated currents such as individual currents $v_2 \cdot G_{21}$ that result from a single resistive element, a current that is output by column as the sum of the individual currents generated by the resistive elements of the column. An exponentiation of the generated currents may be performed in step 505 in accordance with a second exponent e.g. $I=I^\alpha$. Step 505 may be a post-processing step.

Figure 6:
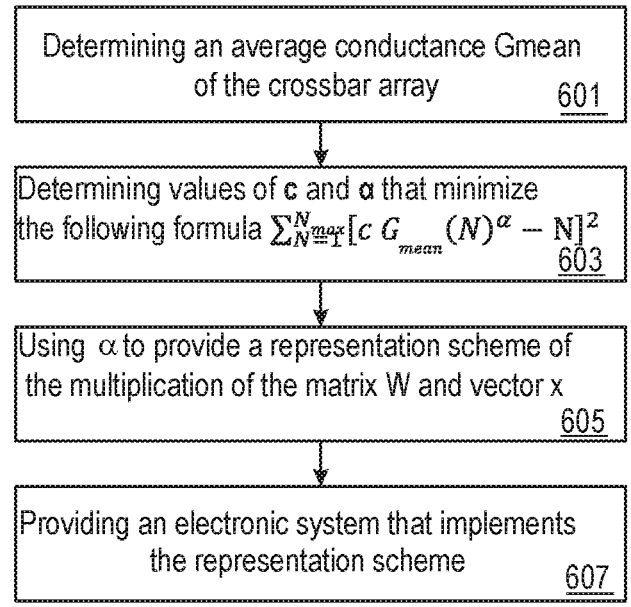
FIG. 6 is a flowchart of a method for representing a matrix with a crossbar array.

FIG. 6 is a flowchart of a method for representing a matrix W with a crossbar array such as crossbar array 100. In step 601, an average conductance $G_{mean}$ of the crossbar array 100 may be determined for a predefined number N of received potentiation pulses at a memristor element. In step 603, values of c and a that minimize the following formula $\Sigma_{N=1}^{Nmax}[cG_{mean}(N)^+-N]^2$ may be identified. In step 605, $\alpha$ may be used to provide a representation scheme of the multiplication of the matrix W and vector x follows:

$$(W \cdot x)_j = \Sigma_i W_{ji} x_i = \frac{W_{max}}{G_{max}^\alpha} \Sigma_i (G_{ji}(x_i)^{1/\alpha})^\alpha.$$

This representation scheme may be used to provide in step 607 an electronic system that performs the multiplication of the matrix W and vector x using the crossbar array. An example of such as system may be system of FIG. 2 or FIG. 3.

Figure 7B:
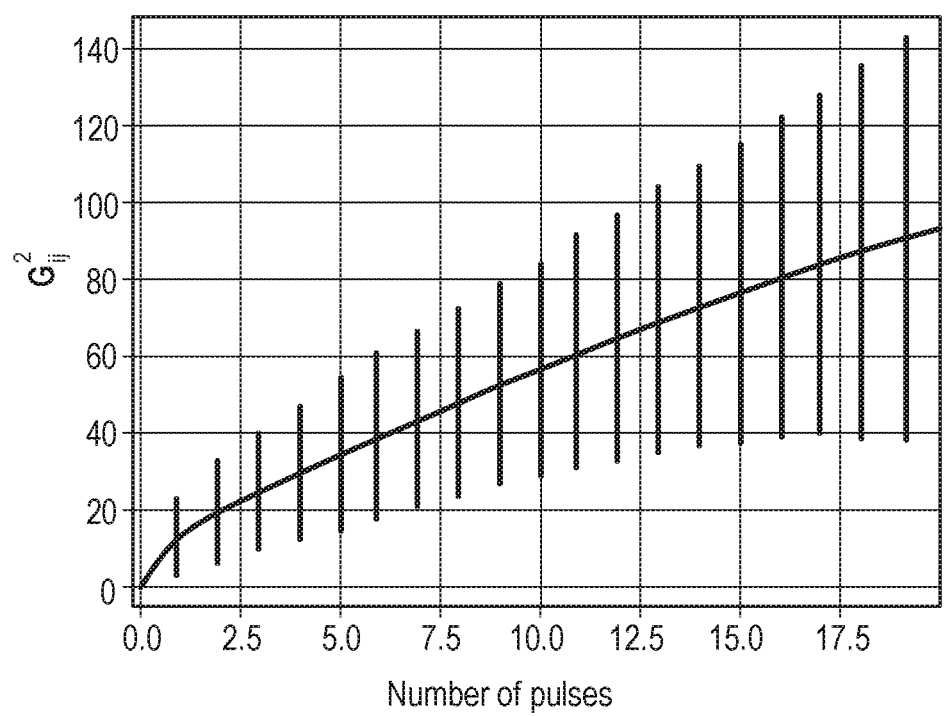
FIG. 7B is the programming curve of a crossbar array in accordance with a second matrix-conductance representation scheme.

FIGS. 7A and 7B show the programming curves for the first representation scheme and second representation scheme respectively for a resistive memory element being a Ge2Sb2Te5 PCM cell. In the example of FIG. 7B the second representation scheme uses α=2. The two curves show the difference in term of linearity between the first and the second representation schemes. FIG. 7A and FIG. 7B show the variation of the conductance $G_{ij}$ as function of the number of programming pulses. As shown in the figures the more programming pulses are applied the higher the conductance value. The curve of FIG. 7A is indicative of the variation $G_{ij}$ as function of the programming pulses. The curve of FIG. 7B is indicative of the variation $G_{ij}^2$ as function of the programming pulses. The linearity of the curve of FIG. 7A may be improved by implementing the second representation scheme with α=2.

In embodiments, an electronic system for performing a multiplication of a matrix and vector may be provided. A system can comprise a memristive crossbar array comprising row lines and column lines intersecting the row lines, and resistive memory elements coupled between the row lines and the column lines at the junctions formed by the row and column lines. The resistive memory elements represent the values of the matrix. The system can further comprise an analogue circuit. The system can be configured to perform an exponentiation of the values of the vector in accordance with a first exponent. The crossbar array can be configured to apply the resulting values of the vector to the resistive elements thereby generating currents. The analogue circuit can be configured to perform an exponentiation of the generated currents in accordance with a second exponent.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An electronic system for performing a multiplication of a matrix and vector, the system comprising a memristive crossbar array comprising row lines and column lines intersecting the row lines, and resistive memory elements coupled between the row lines and the column lines at the junctions formed by the row and column lines, the resistive memory elements representing the values of the matrix, the system further comprising an analogue circuit, the system being configured to perform an exponentiation of the values of the vector in accordance with a first exponent, the crossbar array being configured to apply the resulting values of the vector to the resistive elements thereby generating currents, the analogue circuit being configured for performing an exponentiation of the generated currents in accordance with a second exponent.

2. The system of claim 1, the analogue circuit comprising exponentiation circuits, wherein each exponentiation circuit of the exponentiation circuits is configured to connect to a respective resistive memory element of the crossbar, the exponentiation circuit being configured for performing, using the second exponent, the exponentiation of the current associated with the resistive memory element to which the exponentiation circuit is connected.

3. The system of claim 2, wherein the exponentiation circuit comprises a CMOS current squaring circuit for each current direction of the current.

4. The system of claim 1, wherein the crossbar is configured to apply the values of the vector sequentially, the analogue circuit comprising for each column line of the crossbar an exponentiation circuit and an integration circuit, wherein for each sequentially applied value and for each column line of the crossbar, the exponentiation circuit being configured to perform the exponentiation of the current output of the column line resulting from the application of that value, and the integration circuit being configured to integrate the current output.

5. The system of claim 4, wherein the exponentiation and integration circuits are part of a single circuit.

6. The system of claim 4, wherein the system is configured to activate a row line of the crossbar that receives the value of the vector to be applied.

7. The system of claim 1, further comprising a digital or analogue co-pressor logic configured for performing the exponentiation of the values of the vector in accordance with a first exponent.

8. The system of claim 1, wherein the ratio of first and second exponents is 1.

9. The system of claim 1, the first and second exponents are provided such that the matrix items Wij can be mapped to the conductances Gij of the elements of the crossbar array as follows:

$$W_{ij} = \frac{W_{max}}{G_{max}^\alpha} G_{ij}^\alpha, \text{ where } (W \cdot x)_j = \sum_i W_{ji} x_i = \frac{W_{max}}{G_{max}^\alpha} \sum_i \left(G_{ji}(x_i)^{1/\alpha}\right)^\alpha,$$

wherein the first exponent is $1/\alpha$ and the second exponent is $\alpha$, wherein Wmax and Gmax are predefined range values.

10. The system of claim 9, wherein the exponentiation of a value x of the vector is performed as follows: $\text{sign}(x)|x|^{1/\alpha}$, and the exponentiation of a current I is performed as follows $\text{sign}(I)|I|^\alpha$.

11. A method for performing a multiplication of a matrix and vector for a system comprising a memristive crossbar array, the crossbar array comprising row lines and column lines intersecting the row lines, and resistive memory elements coupled between the row lines and the column lines at the junctions formed by the row and column lines, the resistive memory elements representing the values of the matrix, the method comprising
performing an exponentiation of the values of the vector in accordance with a first exponent, applying the resulting values of the vector to the resistive elements thereby generating currents, and
performing an exponentiation of the generated currents in accordance with a second exponent.

12. The method of claim 11, further comprising:
determining an average conductance $G_{mean}$ of the crossbar array for a predefined number N of received potentiation pulses at the crossbar array;
finding values of c and $\alpha$ that minimize $\Sigma_{N=1}^{Nmax}[c\, G_{mean}(N)^\alpha - N]^2$, wherein the first exponent is $1/\alpha$ and the second exponent is $\alpha$.

13. The method of claim 11, wherein the crossbar array represents at least part of a deep neural network, wherein the method is performed for forward and backward propagation during learning of the deep neural network.

14. The method of claim 11, the first and second exponents are provided such that the matrix items Wij can be mapped to the conductances Gij of the elements of the crossbar array as follows:

$$W_{ij} = \frac{W_{max}}{G_{max}^\alpha} G_{ij}^\alpha, \text{ where } (W \cdot x)_j = \sum_i W_{ji} x_i = \frac{W_{max}}{G_{max}^\alpha} \sum_i \left(G_{ji}(x_i)^{1/\alpha}\right)^\alpha,$$

wherein the first exponent is $1/\alpha$ and the second exponent is $\alpha$, wherein Wmax and Gmax are predefined range values.

15. The method of claim 11, wherein the exponentiation of a value x of the vector is performed as follows: $\text{sign}(x)|x|^{1/\alpha}$, and the exponentiation of a current I is performed as follows $\text{sign}(I)|I|^{\alpha}$.

16. A computer program product comprising a computer-readable storage medium having computer-readable program code embodied therewith, the computer-readable program code configured to performing a multiplication of a matrix and vector for a system comprising a memristive crossbar array, the crossbar array comprising row lines and column lines intersecting the row lines, and resistive memory elements coupled between the row lines and the column lines at the junctions formed by the row and column lines, the resistive memory elements representing the values of the matrix, the computer-readable program code being configured to perform an exponentiation of the values of the vector in accordance with a first exponent, apply the resulting values of the vector to the resistive elements thereby generating currents, and perform an exponentiation of the generated currents in accordance with a second exponent.

* * * * *